(12) United States Patent
Farrar (10) Patent No.: US 6,522,008 B2
(45) Date of Patent: Feb. 18, 2003

(54) SUBTRACTIVE METALLIZATION STRUCTURE WITH LOW DIELECTRIC CONSTANT INSULATING LAYERS

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/991,666

(22) Filed: Nov. 26, 2001

(65) Prior Publication Data

US 2002/0033538 A1 Mar. 21, 2002

Related U.S. Application Data

(62) Division of application No. 09/653,560, filed on Aug. 31, 2000.

(51) Int. Cl.[7] .................................................. H01L 23/48
(52) U.S. Cl. ........................ 257/758; 438/622; 438/623; 257/759
(58) Field of Search ................................ 257/758, 759; 438/622, 623, 471

(56) References Cited

U.S. PATENT DOCUMENTS

| 5,470,801 | A | * | 11/1995 | Kapoor et al. ............... 437/238 |
| 5,485,038 | A | | 1/1996 | Licari et al. |
| 5,486,493 | A | * | 1/1996 | Jeng et al. .................... 437/195 |
| 5,660,738 | A | | 8/1997 | Hunter, Jr. et al. |
| 5,661,344 | A | | 8/1997 | Havemann et al. |
| 5,707,893 | A | | 1/1998 | Bhatt et al. |
| 5,904,859 | A | | 5/1999 | Degani |
| 5,913,141 | A | | 6/1999 | Bothra |
| 6,159,842 | A | | 12/2000 | Chang et al. |
| 6,258,715 | B1 | * | 7/2001 | Yu et al. ...................... 438/648 |

FOREIGN PATENT DOCUMENTS

EP          0 680 084 A1    11/1995

OTHER PUBLICATIONS

International Search Report, Jul. 5, 2002.

* cited by examiner

Primary Examiner—David Nelms
Assistant Examiner—Thao P. Le
(74) Attorney, Agent, or Firm—Dickstein Shapiro Morin & Oshinsky LLP (57) ABSTRACT

A subtractive metallization structure with a plurality of low dielectric constant insulating layers acting as etch stops is disclosed. The selected low dielectric constant materials have similar methods of formation and similar capacities to withstand physical and thermal stress. In addition, the etchant used for each low dielectric constant insulating layer has a very small etching rate relative to the other low dielectric constant insulating layers.

20 Claims, 6 Drawing Sheets

SUBTRACTIVE METALLIZATION STRUCTURE WITH LOW DIELECTRIC CONSTANT INSULATING LAYERS

This application is a divisional of application Ser. No. 09/653,560, filed on Aug. 31, 2000, which is incorporated herein by reference.

FIELD OF THE INVENTION

The present invention relates to semiconductor devices and methods of making such devices. More particularly, the invention relates to a method of forming multilevel subtractive metallization structures.

BACKGROUND OF THE INVENTION

The integration of a large number of components on a single integrated circuit (IC) chip requires complex interconnects. Ideally, the interconnect structures should be fabricated with minimal signal delay and optimal packing density. The reliability and performance of integrated circuits may be affected by the qualities of their interconnect structures.

Advanced multiple metallization layers have been used to accommodate higher packing densities as devices shrink below sub-0.25 micron design rules. One such metallization scheme is a dual damascene structure formed by a dual damascene process, which is an additive metallization process. Another metallization scheme is a multilevel subtractive structure formed by a subtractive metallization process. While the additive metallization involves the addition of metal into defined channels in a dielectric material, such as silicon dioxide, the subtractive metallization involves the removal of unprotected portions of a previously deposited metal, for example aluminum, to define portions of integrated circuitry on a substrate.

Figure 1:
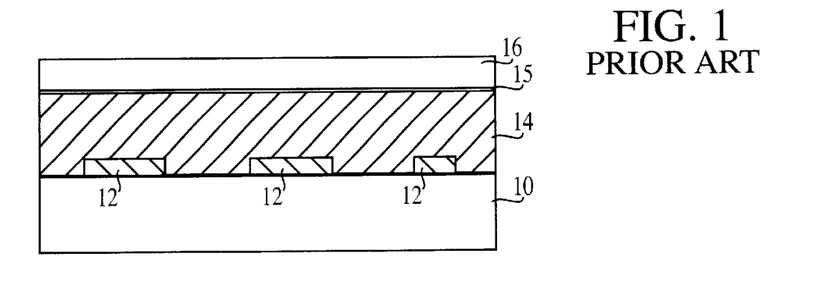
FIG. 1 is a cross sectional view of a subtractive metallization structure at a preliminary stage of production and in accordance with the prior art.
Figure 2:
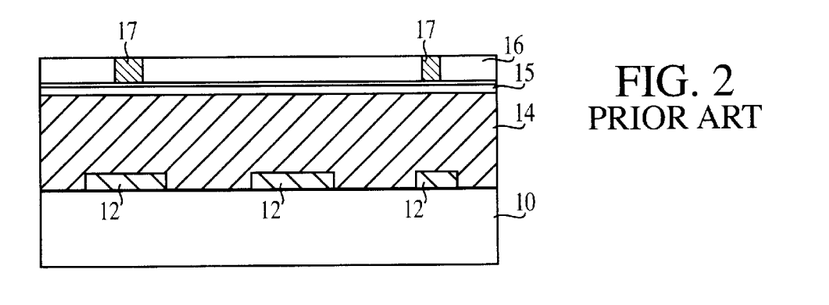
FIG. 2 is a cross sectional view of the subtractive metallization structure of FIG. 1 at a subsequent stage of production.
Figure 3:
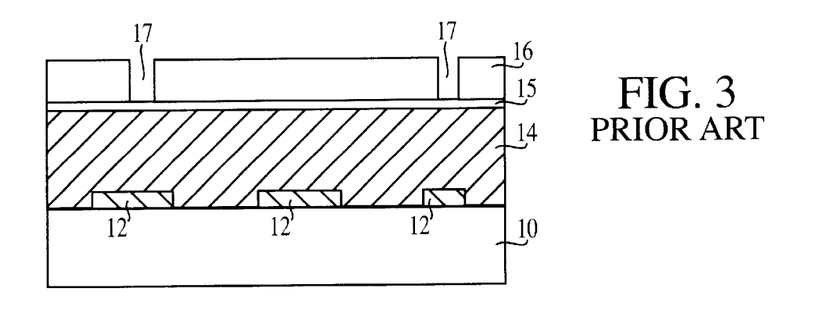
FIG. 3 is a cross sectional view of the subtractive metallization structure of FIG. 2 at a subsequent stage of production.

As illustrated in FIG. 1, one of the known subtractive metallization processes begins with the deposition of a first insulating layer 14 over regions of interconnect metal 12 previously patterned and formed over a semiconductor substrate 10. The insulating layer 14 is patterned by photolithography using a resist layer 16 and a hard mask layer 15 to form via holes 17 (FIGS. 2–3) corresponding to a metal line of the first level interconnect. To prevent the via etch from attacking the underlying substrate, the metal lines are widened at the position of the via, therefore reducing the density of wiring which is obtainable on a given level.

After the via etching is complete, a blanket metal layer is deposited. If a barrier material is required, a blanket layer of the barrier material is deposited prior to the deposition of the metal layer. For example, a titanium or zirconium layer of about few hundred Angstroms thick may be deposited prior to the deposition of a thick aluminum 0.5% copper alloy metallurgy, of about 5,000 to 10,000 Angstroms. Following the metal deposition, a layer of photoresist is deposited and, using an appropriate mask, the metal pattern is imaged into the resist. Then, using an appropriate etching process such as a reactive ion etching, for example, the metal pattern is defined. If a third level of metal is desired, a second layer of the insulator is deposited through which vias are etched, followed by the deposition and etching of another metal level. This process is repeated to acquire the desired number of metal levels.

Figure 4:
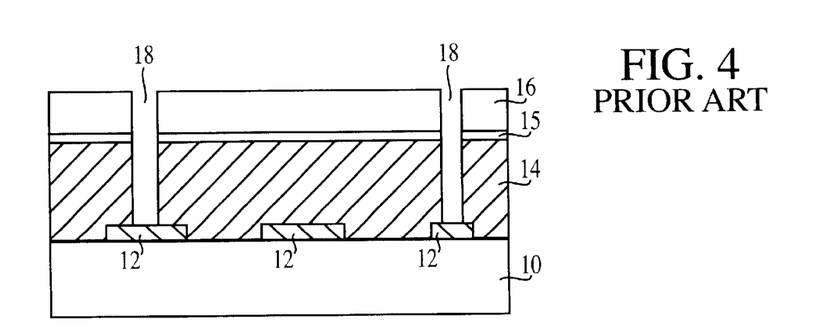
FIG. 4 is a cross sectional view of the subtractive metallization structure of FIG. 3 at a subsequent stage of production.
Figure 5:
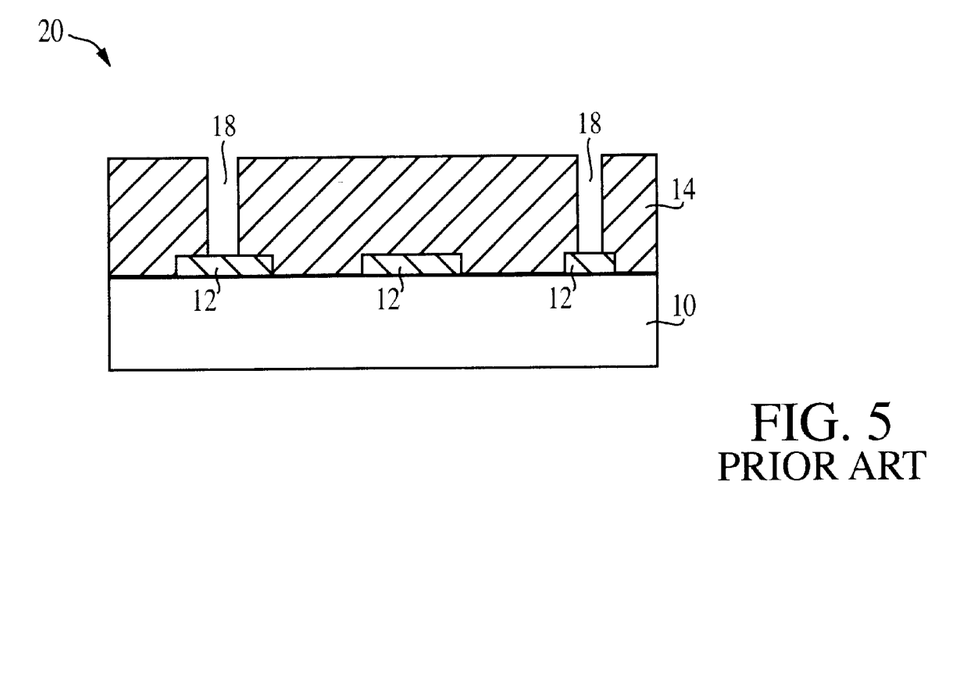
FIG. 5 is a cross sectional view of the subtractive metallization structure of FIG. 4 at a subsequent stage of production.

Subtractive metallization processes such as the one described above pose some drawbacks. One drawback is the substantial undercutting which occurs typically during etching for the formation of vias, such as vias 18 of FIG. 4. Misalignment of vias 18 with the underlying interconnect metal 12 often occurs so that, during etching, the underlying substrate is unfortunately etched also as a result of the vias overlap with the interconnect metal. Accordingly, regions of interconnect metal 12 are patterned wider and larger to eliminate any overlap. However, increasing the width, thickness and/or spacing of the interconnect metal is not compatible with the stringent requirements of packing density. Further, high-resolution devices cannot be effectively produced with these limitations.

The problem could be eliminated by the use of one or more etch stop layers. Although the advantages of using the etch stop layers are significant, the process is complex since separate depositions are required for the etch stop layers. In addition, the most commonly used etch stop material, silicon nitride ($Si_3N_4$), has a rather high dielectric constant (k) (approximately 7), which does not satisfy anymore the requirement of resistance-capacitance delay regarding the parasitic capacitance generated by an intermetal insulating layer. As integrated circuits become denser, it is increasingly important to minimize stray capacitance between the metal layers. This is accomplished by using intermetal insulating layers that have a low dielectric constant, such as, for example, organic dielectric materials. Silicon nitride does not satisfy the requirement of small stray capacitance of advanced metallization structures.

Accordingly, there is a need for an improved subtractive metallization structure which reduces production costs and increases productivity. There is also a need for a subtractive metallization process that has zero overlap between the vias and the underlying metal and which does not require etch stop layers. There is further needed a method for decreasing the stray capacitance between the metal layers of subtractive metallization structures.

SUMMARY OF THE INVENTION

The present invention provides a method for fabricating a subtractive metallization structure in a semiconductor device. According to one aspect of the invention, productivity can be increased, as the wiring density is increased and fewer processing steps are required. According to another aspect of the invention, the use of high dielectric etch stop materials may be avoided, so as to reduce or minimize stray capacitance.

In an exemplary embodiment, a plurality of low dielectric constant materials are selected so that they have similar methods of formation, as well as similar capacities to withstand physical and thermal stress. The low dielectric constant materials act as insulating layers through which vias are subsequently formed according to subtractive metallization processing. The low dielectric constant materials are selected so that the etchant used for each one has only a small etch rate relative to the other low dielectric constant materials. As a result, the plurality of low dielectric constant materials can act as etch stops relative to other low dielectric constant materials during the fabrication of subtractive metallization structures.

Additional features and advantages of the present invention will be more clearly apparent from the detailed description which is provided in connection with accompanying drawings which illustrate exemplary embodiments of the invention.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. The term should be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

The present invention provides a method for fabricating a subtractive metallization structure in which a plurality of low dielectric constant materials are selected with similar methods of formation, as well as with similar capacities to withstand physical and thermal stress. The low dielectric constant materials act as insulating layers through which vias are subsequently formed.

Figure 6:
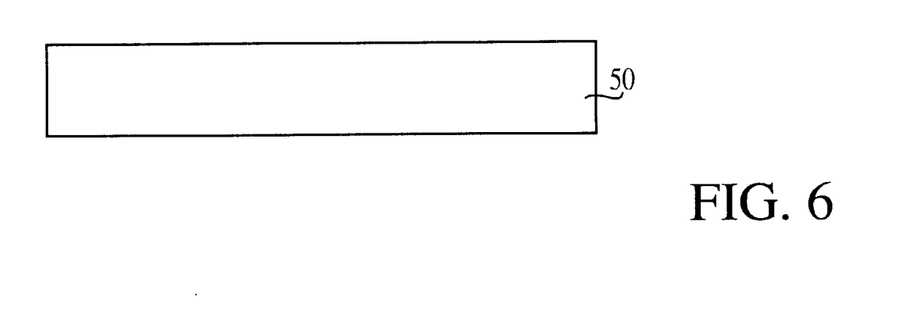
FIG. 6 is a cross sectional view of a subtractive metallization structure at a preliminary stage of production and in accordance with an exemplary embodiment of the present invention.
Figure 7:
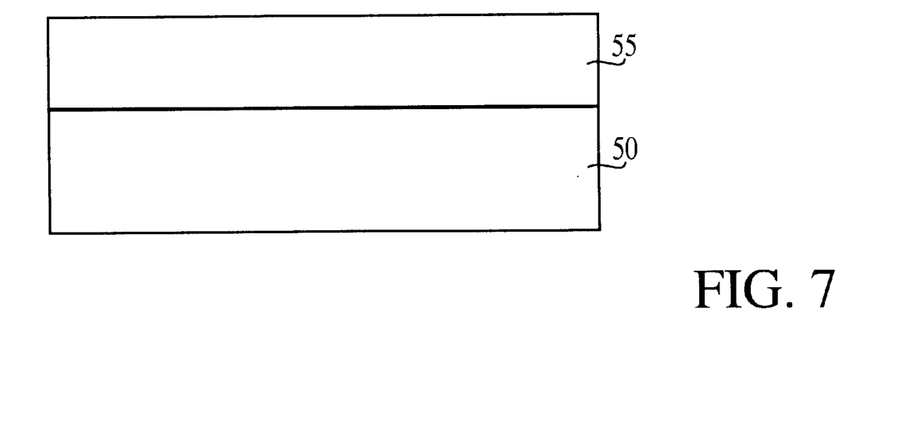
FIG. 7 is a cross sectional view of the subtractive metallization structure of FIG. 6 at a subsequent stage of production.

Referring now to the drawings, where like elements are designated by like reference numerals, FIG. 6 depicts a portion of a semiconductor substrate 50. A first intermetal insulating layer 55 is formed overlying the substrate 50, as shown in FIG. 7.

In an exemplary embodiment of the present invention, the first intermetal insulating layer 55 is blanket deposited by spin coating to a thickness of about 2,000 Angstroms to 15,000 Angstroms, more preferably about 6,000 to 10,000 Angstroms. The first intermetal insulating layer 55 may be cured at a predefined temperature, depending on the nature of the material. Other known deposition methods, such as sputtering by chemical vapor deposition (CVD), plasma enhanced CVD (PECVD), or physical vapor deposition (PVD), may be used also for the formation of the first intermetal insulating layer 55, as desired. Desirably, the first intermetal insulating layer 55 is selected so that the etchant for this layer does not attack the underlying substrate material to any great extent.

The first intermetal insulating layer 55 may be formed of a low dielectric constant organic material such as, for example, polyimide, spin-on-polymers (SOP), flare, polyarylethers, parylene, polytetrafluoroethylene, benzocyclobutene (BCB) or SILK. Alternatively, the first intermetal insulating layer 55 may be formed of an inorganic material with a low dielectric constant such as, for example, fluorinated silicon oxide (FSG), hydrogen silsesquioxane (HSQ) or NANOGLASS. The present invention is not limited, however, to the above-listed materials and other organic and inorganic materials with low dielectric constant may be used. For purposes of the invention, a low dielectric constant material is one whose dielectric constant (k) is lower than that of silicon oxide ($SiO_2$), which is approximately 4.0.

Figure 8:
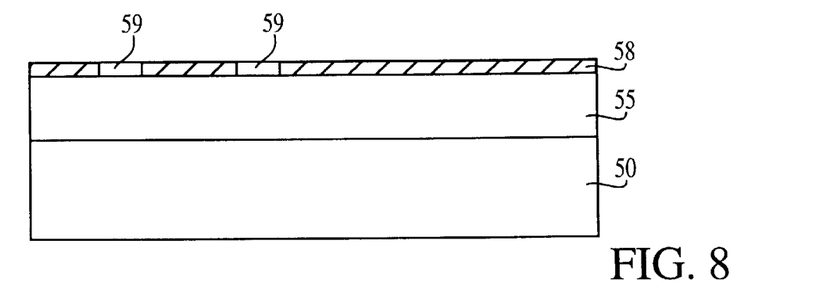
FIG. 8 is a cross sectional view of the subtractive metallization structure of FIG. 7 at a subsequent stage of production.
Figure 9:
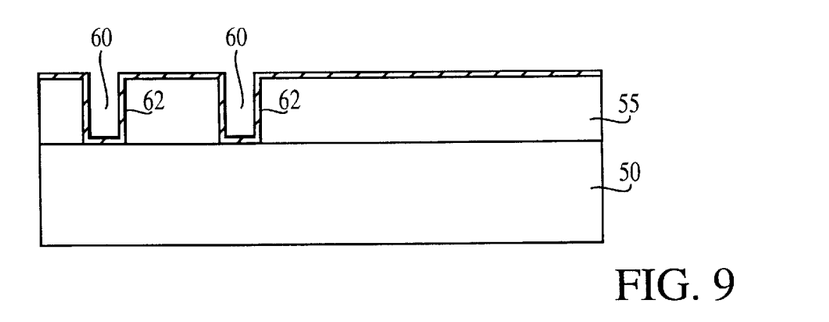
FIG. 9 is a cross sectional view of the subtractive metallization structure of FIG. 8 at a subsequent stage of production.

Next, as illustrated in FIG. 8, a first photoresist layer 58 is formed over the first intermetal insulating layer 55. The first photoresist layer 58 is then patterned with a mask (not shown) having images of via patterns 59. Thus, vias 60 may be formed, as shown in FIG. 9, by etching through openings in the first photoresist layer 58 and into the first intermetal insulating layer 55. The etchant may be selected in accordance with the characteristics of the first insulating material 55. The etchant (not shown) will selectively etch the first insulating material 55 until it reaches the semiconductor substrate 50. Thus, after the removal of the first photoresist layer 58, vias 60 are formed into the first intermetal insulating layer 55, as illustrated in FIG. 9.

Subsequent to the formation of the vias 60, a barrier layer 62 (FIG. 9) is formed on the vias 60 and the first intermetal insulating layer 55 by CVD, PVD, sputtering or evaporation, to a thickness of about 50 Angstroms to about 200

Angstroms, more preferably of about 100 Angstroms. Preferred materials for the barrier layer 62 are metals, such as titanium (Ti), zirconium (Zr), tungsten (W), or hafnium (Hf), or metal compounds, such as tantalum nitride (TaN), which may be applied by blanket deposition. If desired, the barrier layer 62 may be formed of refractory metal compounds, for example refractory metal nitrides such as TiSi and ZrSi. In any event, the barrier layer 62 suppresses the diffusion of the metal atoms from the subsequently deposited conductive material (FIGS. 10–16), while offering a low resistivity and low contact resistance between the conductive material and the barrier layer 62. As known in the art, the material for the barrier layer 62 is selected according to the type of metallurgy and/or insulators employed.

Figure 10:
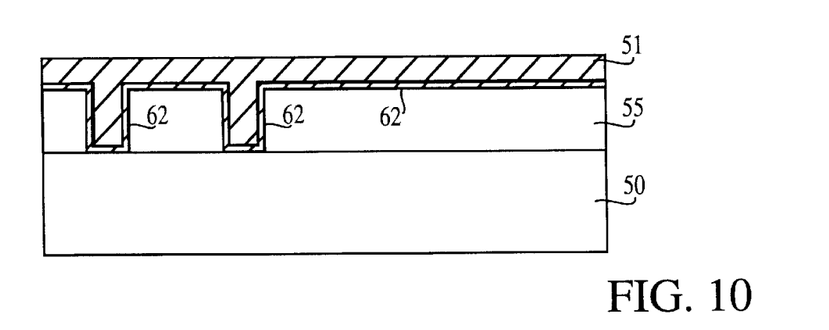
FIG. 10 is a cross sectional view of the subtractive metallization structure of FIG. 9 at a subsequent stage of production.

Next, as illustrated in FIG. 10, a conductive material layer 51 is formed overlying the barrier layer 62 and filling in the vias 60. The conductive material layer 51 may be blanket deposited by a known PVD, CVD, or a combination of these techniques to fill in vias 60. Alternatively, the conductive material layer 51 may be deposited by a plating technique.

Figure 11:
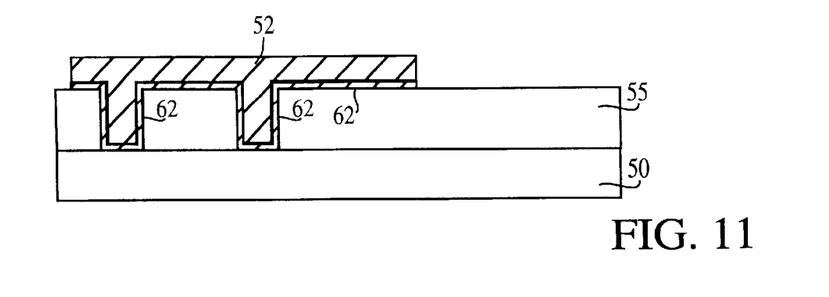
FIG. 11 is a cross sectional view of the subtractive metallization structure of FIG. 10 at a subsequent stage of production.

If necessary, a second barrier layer may be deposited on top of the conductive material layer 51. For example, in the case of aluminum or aluminum copper alloy structures, a layer of titanium (Ti) or zirconium (Zr) is often used both above and below the aluminum alloy layer to improve electromigration resistance of the lines. In any event, the conductive and barrier layers 51, 62 are patterned, by reactive ion etching for example, to form a subtractive pattern 52, as shown in FIG. 11. The subtractive pattern 52 represents a lower interconnects which are to be later interconnected with an upper interconnect layer. The subtractive pattern 52 may be formed of aluminum-copper (Al—Cu), but other conductive materials, such as tungsten (W), copper (Cu), gold (Au), silver (Ag) or aluminum (Al) and their alloys may be used also.

Figure 12:
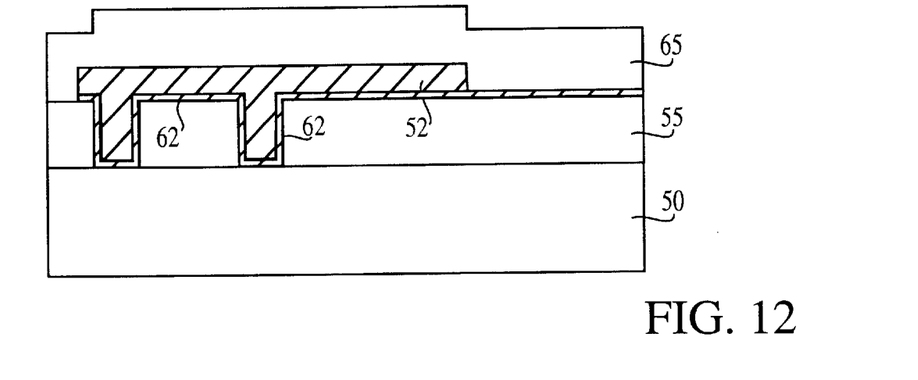
FIG. 12 is a cross sectional view of the subtractive metallization structure of FIG. 11 at a subsequent stage of production.
Figure 13:
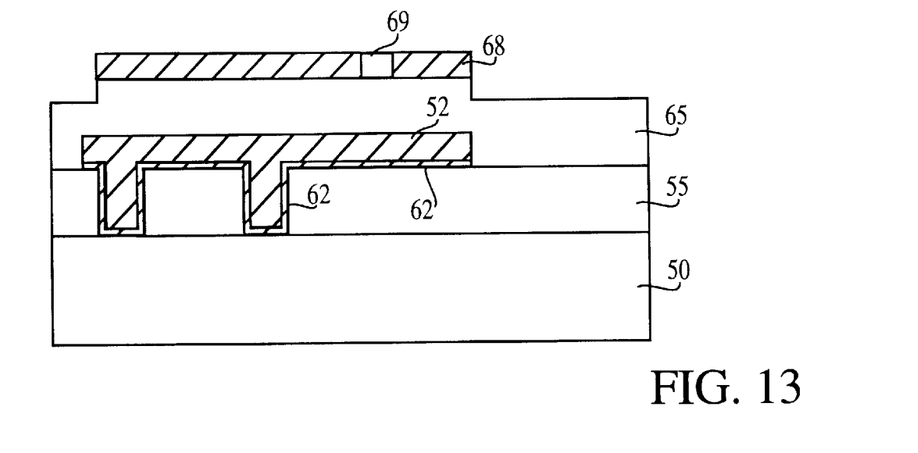
FIG. 13 is a cross sectional view of the subtractive metallization structure of FIG. 12 at a subsequent stage of production.

Referring now to FIG. 12, a second intermetal insulating layer 65 is formed overlying the first intermetal insulating layer 55 and the subtractive pattern 52. The second intermetal insulating layer 65 may be formed, for example, by spin coating to a thickness of about 2,000 Angstroms to about 15,000 Angstroms, more preferably of about 6,000 to 10,000 Angstroms. Following deposition, the second intermetal insulating layer 65 is cured at a predefined temperature, depending, again, on the nature and specific characteristics of the insulating material. Other deposition methods, such as the ones mentioned above with reference to the formation of the first intermetal insulating layer 55, may be used also.

The material of choice for the second intermetal insulating layer 65 is also a low dielectric constant organic or inorganic material, with a dielectric constant lower than 4.0, as the ones listed above with reference to the first intermetal insulating layer 55. However, as discussed in more detail below, the two intermetal insulating layers 55, 65 and the etch chemistries used to selectively remove these intermetal insulating layers may be physically and functionally related to each other. As such, the two insulating layers 55, 65 may be deposited in a similar manner and by similar methods. In addition, the insulating layers 55, 65 are preferably compatible with each other in the sense that each of them may be capable of withstanding stress levels which will be later induced as a result of various processes and during the use of the IC device. Further, each material should be capable of withstanding the maximum temperature required in the processing of the other one.

In a preferred embodiment of the present invention, two compatible materials for the two intermetal insulating layers 55, 65 are SILK (organic material with k of approximately 2.65 at 100 kHz) and NANOGLASS (inorganic material with k of approximately 3.5 at 100 kHz). Both SILK and NANOGLASS can be applied by spin coating and both are capable of withstanding similar stress levels, as well as the processing temperature of each other. Further, both SILK and NANOGLASS may be individually etched by a respective etchant which, while readily etching one insulating material, will have only a very small, negligible etch rate for the other insulating material.

Another example of two compatible low dielectric constant materials is a foamed polyimide (as the organic component with k in the range of 2.0 to 3.0, depending upon the degree of porosity) and hydrogen silsesquioxane (HSQ) (as the inorganic component with k in the range of 2.3 to 3.0). However, other combinations may also be employed. Further, two low dielectric constant organic materials, as well as two low dielectric constant inorganic materials may be used also, as long as both materials retain compatible physical and chemical properties. Thus, the present invention is not limited to the use of the above-mentioned combinations, and other compatible low dielectric constant materials may be used also, i.e. those with dielectric constants lower than 4.0.

Figure 14:
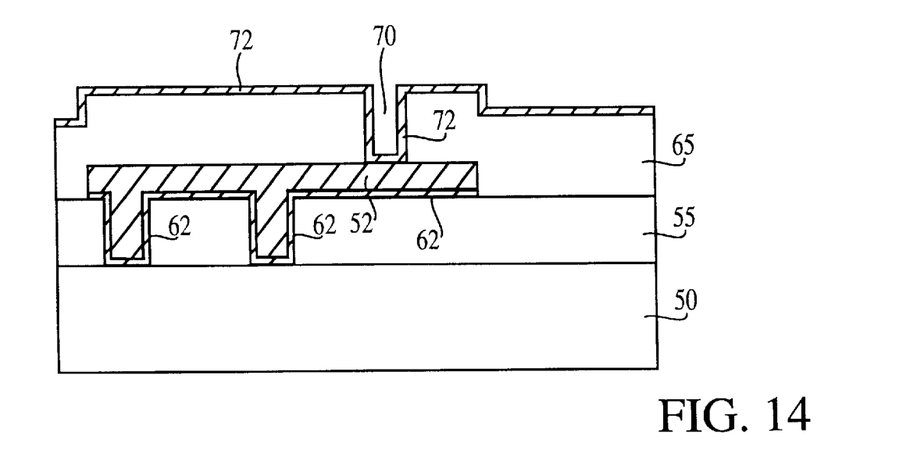
FIG. 14 is a cross sectional view of the subtractive metallization structure of FIG. 13 at a subsequent stage of production.
Figure 15:
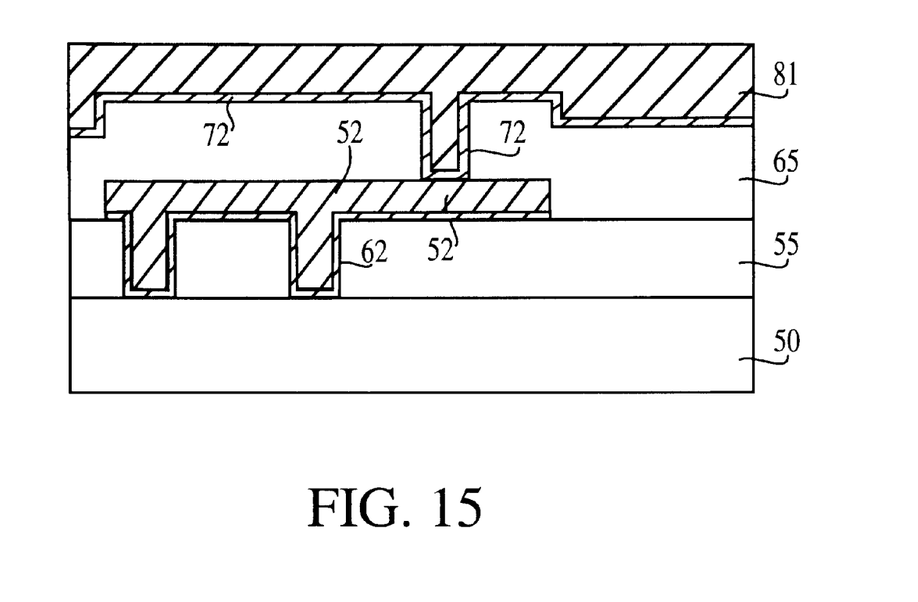
FIG. 15 is a cross sectional view of the subtractive metallization structure of FIG. 14 at a subsequent stage of production.

After the formation of the second intermetal insulating layer 65, a via 70 (FIG. 14) may be formed by photolithography. As such, a second photoresist layer 68 (FIG. 13) is formed over the second intermetal insulating layer 65. The second photoresist layer 68 is then patterned with a mask (not shown) having images of a via pattern 69. The via pattern 69 is then etched into the second intermetal insulating layer 65 to form via 70, as shown in FIG. 14. The thickness of the second intermetal insulating layer 65 defines the thickness of the via 70. The thickness of the first intermetal insulating layer 65 defines the thickness of the via 60.

The etching of the via 70 (FIG. 14) is accomplished by employing a second etchant to selectively etch the second intermetal insulating layer 65 through to the subtractive pattern 52, or in the alternative, through to the first intermetal insulating layer 55. In an exemplary embodiment of the present invention, which employs the SILK/NANOGLASS combination, the first etchant (for selectively etching the first intermetal insulating SILK layer 55) may employ oxygen ($O_2$) plasma, while the second etching (for etching through the second intermetal insulating NANOGLASS layer 65) may employ a chlorine (Cl) plasma.

Subsequent to the formation of the via 70, a barrier layer 72 (FIG. 14) is formed on the via 70 and over the second intermetal insulating layer 65 by CVD, PVD, sputtering or evaporation, to a thickness of about 50 Angstroms to about 200 Angstroms, more preferably of about 100 Angstroms. Preferred materials for the barrier layer 72 are metals, such as titanium (Ti), zirconium (Zr), tungsten (W), or hafnium (Hf), or metal compounds, such as tantalum nitride (TaN). If desired, the barrier layer 72 may be formed of refractory metal compounds, for example refractory metal silicide such as TiSi or ZrSi. In any event, the barrier layer 72 suppresses the diffusion of the metal atoms from the subsequently deposited conductive material (FIGS. 15–16), while offering a low resistivity and low contact resistance between the conductive material and the barrier layer 72.

After the formation of the via 70 through the second intermetal insulating layer 65, further steps to create a subtractive metallization structure 100 (FIG. 16) may be carried out. Accordingly, a conductive material layer 81 is next deposited overlying the second intermetal insulating layer 65 and filling in the via 70. In the preferred embodiment, the conductive material layer 81 comprises either copper, tungsten, gold, silver, aluminum, or their alloys, but it must be understood that other materials may be used also. In any event, the conductive material 81 may be blanket deposited by a known PVD, CVD, or a combination of these techniques to fill in the via 70. Alternatively, the conductive material layer 81 may be deposited by a plating technique.

Figure 16:
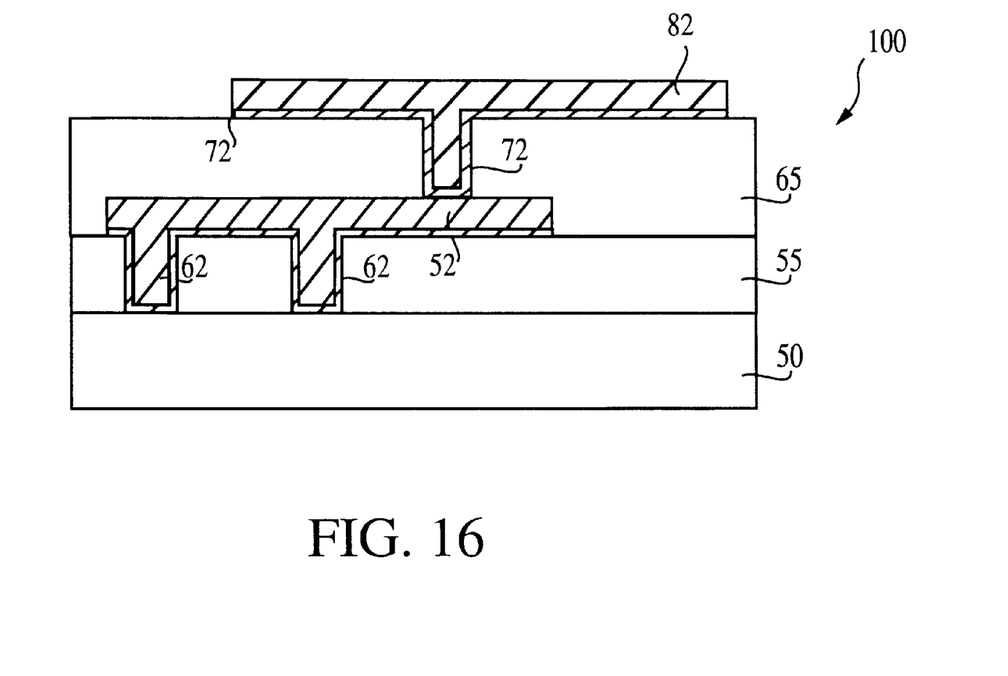
FIG. 16 is a cross sectional view of the subtractive metallization structure of FIG. 15 at a subsequent stage of production.

The conductive material layer 81 (FIG. 15) and the underlying barrier layer 72 are next patterned and etched to form a subtractive pattern 82 and to complete the formation of the subtractive metallization structure 100 illustrated in FIG. 16.

Although only one subtractive metallization structure 100 is shown in FIG. 16, it must be readily apparent to those skilled in the art that in fact any number of such subtractive metallization structures may be formed on the substrate 50. Also, although the exemplary embodiment described above refers to the formation of a subtractive metallization structure 100 in which only two intermetal insulating layers are employed, it must be understood that the invention is applicable to any number of alternating low dielectric constant insulating layers formed over the substrate 50, in which vias are filled with conductive material, as part of more complex metallization schemes. Further, the invention is not limited to the use of SILK and NANOGLASS, but may be used with other compatible organic and/or inorganic materials with dielectric constants lower than 4.0.

The technique described and illustrated with reference to FIGS. 6–16 may be used to form interconnect metallization layers in any type of analog, digital or hybrid integrated circuit structures including, but not limited to, processors, memory devices, ASIC controllers, etc.

Figure 17:
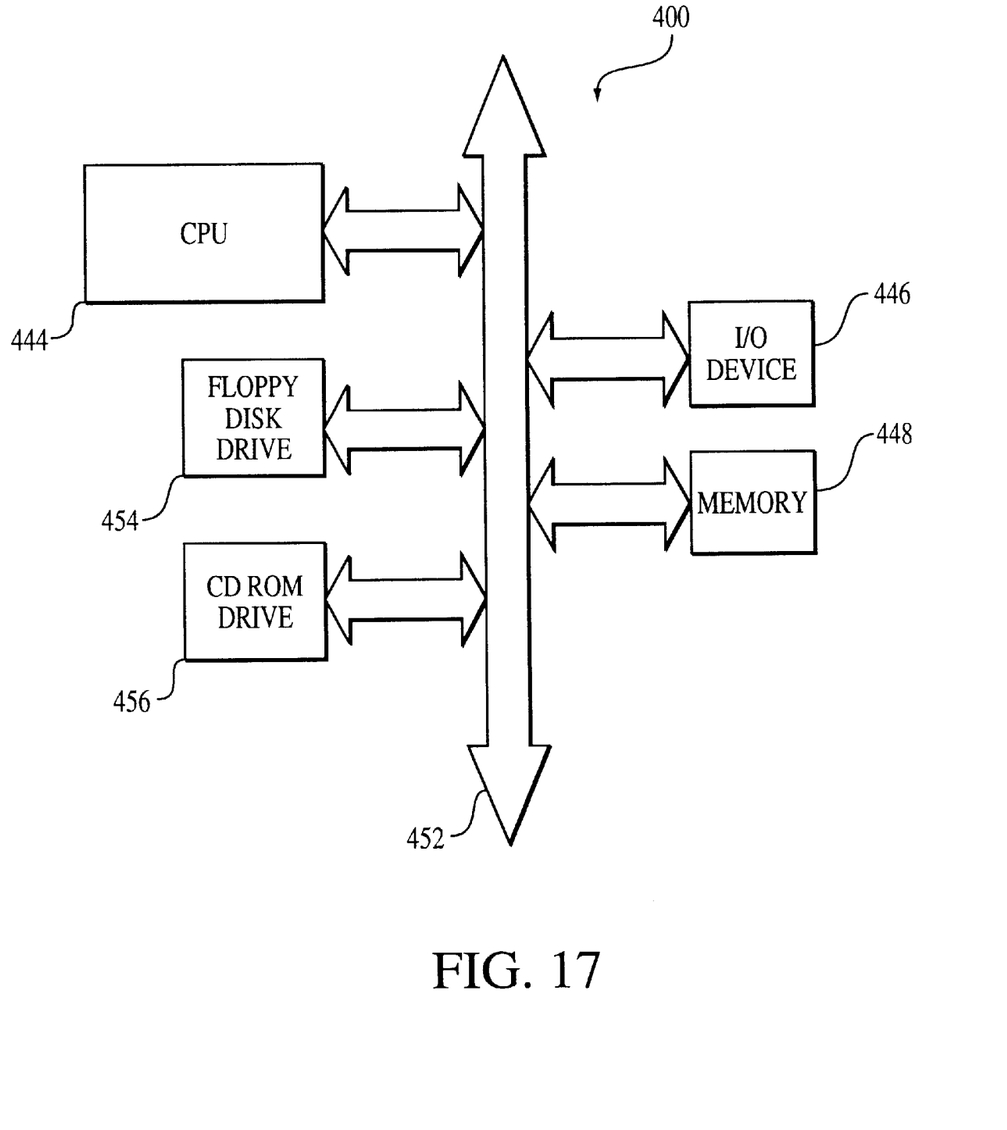
FIG. 17 illustrates a computer system having a memory cell with a dual damascene structure according to the present invention.

For example, a typical processor-based system 400 which includes a memory circuit 448, for example a DRAM, containing subtractive metallization structures according to the present invention is illustrated in FIG. 17. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes one or more subtractive metallization structures 100. CPU 444 may also employ one or more subtractive metallization structures formed in accordance with the invention. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An integrated circuit structure, comprising:

a first insulating layer with a first dielectric constant lower than 4.0 provided over a semiconductor substrate and including at least a portion of a metal layer provided in a first via formed within said first insulating layer;

a second insulating layer with a second dielectric constant lower than 4.0 provided over and in contact with said first insulating layer, said second and first insulating layers being capable of withstanding similar stress levels and processing temperatures; and a second via formed within a said second insulating layer and extending to said first via.

2. The integrated circuit structure of claim 1, wherein said first insulating layer comprises an organic material.

3. The integrated circuit structure of claim 2, wherein said organic material is selected from the group consisting of polyimide, spin-on-polymers, flare, polyarylethers, parylene, polytetrafluoroethylene, benzocyclobutene and SILK.

4. The integrated circuit structure of claim 3, wherein said first insulating layer comprises SILK.

5. The integrated circuit structure of claim 1, wherein said first insulating layer comprises an inorganic material.

6. The integrated circuit structure of claim 5, wherein said inorganic material is selected from the group consisting of fluorinated silicon oxide, hydrogen silsesquioxane and NANOGLASS.

7. The integrated circuit structure of claim 1, wherein said first insulating layer has a thickness of about 2,000 to 15,000 Angstroms.

8. The integrated circuit structure of claim 1, wherein said second insulating layer comprises organic material.

9. The integrated circuit structure of claim 8, wherein said organic material layer is selected from the group consisting of polyimide, spin-on-polymers, flare, polyarylethers, parylene, polytetrafluoroethylene, benzocyclobutene and SILK.

10. The integrated circuit structure of claim 1, wherein said second insulating layer comprises inorganic material.

11. The integrated circuit structure of claim 10, wherein said inorganic material is selected from the group consisting of fluorinated silicon oxide, hydrogen silsesquioxane and NANOGLASS.

12. The integrated circuit structure of claim 1, wherein said second insulating layer has a thickness of about 2,000 to 15,000 Angstroms.

13. The integrated circuit structure of claim 1, wherein said first and second insulating layers are formed of different materials which can be selectively etched relative to each other.

14. A processor-based system, comprising:

a processor; and an integrated circuit coupled to said processor, at least one of said processor and integrated circuit including a subtractive metallization structure, said subtractive metallization structure comprising a first low dielectric constant insulating layer with a first via formed within said first low dielectric constant insulating layer, and a second low dielectric constant insulating layer over said first low dielectric constant insulating layer with a second via formed within said second low dielectric constant insulating layer and extending to said first via.

15. A subtractive metallization structure on a semiconductor substrate, comprising:

at least a first insulating layer with a dielectric constant lower than that of silicon oxide provided over said semiconductor substrate;

at least a second insulating layer with a dielectric constant lower than that of silicon oxide located in contact with said first insulating layer; and at least a third insulating layer located over said second insulating layer, said first, second, and third insulating layers being capable of withstanding similar stress levels and processing temperatures.

16. The subtractive metallization structure of claim 15 further comprising at least one via formed within each of said first, second and third insulating layers.

17. The subtractive metallization structure of claim 16, wherein said via is filled with a conductive material.

18. A subtractive metallization structure comprising:
a SILK insulating layer over a substrate;
a first conductive material located in a first opening formed within said SILK insulating layer;
a NANOGLASS insulating layer in contact with said SILK insulating layer; and
a second conductive material located in a second opening formed within said NANOGLASS layer, said second opening extending to said first conductive material.

19. The subtractive metallization structure of claim 18, wherein said SILK insulating layer has a thickness of about 2,000 to 15,000 Angstroms.

20. The subtractive metallization structure of claim 18, wherein said NANOGLASS insulating layer has a thickness of about 2,000 to 15,000 Angstroms.

* * * * *